(12) United States Patent
Ding et al.

(10) Patent No.: US 10,266,937 B2
(45) Date of Patent: Apr. 23, 2019

(54) COATED ARTICLE HAVING LOW-E COATING WITH IR REFLECTING LAYER(S) AND HAFNIUM INCLUSIVE HIGH INDEX NITRIDED DIELECTRIC LAYER

(71) Applicant: Guardian Glass, LLC, Auburn Hills, MI (US)

(72) Inventors: Guowen Ding, San Jose, CA (US); Daniel Schweigert, San Jose, CA (US); Albert Lee, San Jose, CA (US); Daniel Lee, San Jose, CA (US); Scott Jewhurst, San Jose, CA (US); Guizhen Zhang, San Jose, CA (US); Gaurav Saraf, San Jose, CA (US); Minh Le, San Jose, CA (US); Marcus Frank, Gelhausen (DE)

(73) Assignee: Guardian Glass, LLC, Auburn Hills, MI (US)

( * ) Notice: Subject to any disclaimer, the term of this patent is extended or adjusted under 35 U.S.C. 154(b) by 127 days.

(21) Appl. No.: 15/453,995

(22) Filed: Mar. 9, 2017

(65) Prior Publication Data
US 2018/0258523 A1    Sep. 13, 2018

(51) Int. Cl.
*B32B 15/04*    (2006.01)
*B32B 17/06*    (2006.01)
(Continued)

(52) U.S. Cl.
CPC .............. *C23C 14/34* (2013.01); *C03C 17/36* (2013.01); *C03C 17/366* (2013.01);
(Continued)

(58) Field of Classification Search
USPC ....... 428/426, 428, 432, 434, 688, 697, 701, 428/702
See application file for complete search history.

(56) References Cited

U.S. PATENT DOCUMENTS 4,883,721 A    11/1989   Nalepka et al.
5,344,718 A     9/1994   Hartig et al.
(Continued)

FOREIGN PATENT DOCUMENTS

CN          103073196       5/2013
DE     10 2005 038 139      2/2007
(Continued)

OTHER PUBLICATIONS

U.S. Appl. No. 15/448,620, filed Mar. 3, 2017, Saraf et al.
U.S. Appl. No. 15/448,629, filed Mar. 3, 2017, Ding et al.
U.S. Appl. No. 15/448,739, filed Mar. 3, 2017, Zhang et al.

*Primary Examiner* — Lauren R Colgan
(74) *Attorney, Agent, or Firm* — Nixon & Vanderhye P.C.

(57) ABSTRACT

A coated article includes a low emissivity (low-E) coating having at least one infrared (IR) reflecting layer of a material such as silver, gold, or the like, and at least one hafnium (Hf) inclusive high index nitrided dielectric layer. In certain example embodiments, the hafnium inclusive high index nitrided dielectric layer(s) may be of or include one or more of HfSiAlN, HfZrSiAlN, HfSiN, HfAlN, and/or HfAlZrN. The high index layer may be a transparent dielectric high index layer, with a high refractive index (n) and/or low k value. In example embodiments, the low-E coating may be used in applications such as monolithic or insulating glass (IG) window units, vehicle windows, or the like.

40 Claims, 11 Drawing Sheets
(8 of 11 Drawing Sheet(s) Filed in Color)

(51) Int. Cl.
  *C23C 14/34* (2006.01)
  *C23C 14/06* (2006.01)
  *C03C 17/36* (2006.01)

(52) U.S. Cl.
  CPC ...... *C03C 17/3644* (2013.01); *C03C 17/3652* (2013.01); *C03C 17/3681* (2013.01); *C23C 14/0641* (2013.01); *C03C 2218/154* (2013.01)

(56) References Cited

U.S. PATENT DOCUMENTS

| | | | |
|---|---|---|---|
| 5,377,045 A * | 12/1994 | Wolfe | C03C 17/36 359/360 |
| 5,563,734 A * | 10/1996 | Wolfe | C03C 17/36 204/192.27 |
| 5,723,207 A * | 3/1998 | Lettington | C23C 14/0641 204/192.12 |
| 6,210,784 B1 | 4/2001 | Rondeau et al. | |
| 6,355,334 B1 | 3/2002 | Rondeau et al. | |
| 6,576,349 B2 | 6/2003 | Lingle et al. | |
| 6,602,608 B2 | 8/2003 | Stachowiak | |
| 6,610,410 B2 | 8/2003 | Ebisawa et al. | |
| 7,005,188 B2 | 2/2006 | Anderson et al. | |
| 7,081,301 B2 | 7/2006 | Stachowiak | |
| 7,153,579 B2 | 12/2006 | Kriltz et al. | |
| 7,241,506 B2 | 7/2007 | Hartig | |
| 7,390,572 B2 | 6/2008 | Butz et al. | |
| 8,945,714 B2 | 2/2015 | Lao et al. | |
| 9,028,956 B2 | 5/2015 | Knoll et al. | |
| 9,028,983 B2 | 5/2015 | Imran et al. | |
| 9,052,456 B2 | 6/2015 | Hassan et al. | |
| 9,199,874 B2 | 12/2015 | Peter et al. | |
| 9,212,417 B2 | 12/2015 | Frank et al. | |
| 9,297,197 B2 | 3/2016 | Lao et al. | |
| 9,315,414 B2 | 4/2016 | Hassan et al. | |
| 9,365,450 B2 | 6/2016 | Ding et al. | |
| 9,371,684 B2 | 6/2016 | Butz et al. | |
| 9,403,345 B2 | 8/2016 | Lao et al. | |
| 9,410,359 B2 | 8/2016 | Ding et al. | |
| 9,494,717 B2 | 11/2016 | Reymond et al. | |
| 9,499,437 B2 | 11/2016 | Imran et al. | |
| 9,518,319 B2 | 12/2016 | Ding et al. | |
| 9,556,070 B2 | 1/2017 | Wuillaume et al. | |
| 2006/0023327 A1 * | 2/2006 | Coombs | G02B 5/0816 359/883 |
| 2007/0163873 A1 * | 7/2007 | Kleideiter | C03C 17/3411 204/192.28 |
| 2009/0004412 A1 * | 1/2009 | Decroupet | C03C 17/36 428/34 |
| 2010/0136365 A1 * | 6/2010 | Unquera | C03C 17/36 428/623 |
| 2010/0178492 A1 | 7/2010 | Schicht et al. | |
| 2013/0059137 A1 * | 3/2013 | Hevesi | C03C 17/36 428/213 |
| 2014/0090864 A1 * | 4/2014 | Paulson | C03C 17/225 174/50 |
| 2016/0354995 A1 * | 12/2016 | Lienhart | B32B 15/04 |
| 2018/0258524 A1 * | 9/2018 | Clavero | C23C 14/3464 |

FOREIGN PATENT DOCUMENTS

DE  10 2008 007 981  8/2009
EP  2 746 236  6/2014

* cited by examiner

| | | CE1 | Ex. 1 |
|---|---|---|---|
| Monolithic Optics (Ill 'C', 2 deg obs) | | AC | AC |
| T | Y (%) | 84.65 | 86.1 |
| | a* | -0.97 | -1.47 |
| | b* | 0.11 | 1.28 |
| Rg | Y (%) | 5.4 | 5.3 |
| | a* | -1.7 | 0.29 |
| | b* | -5.25 | -8.2 |
| Rf | Y (%) | 5.26 | 4.46 |
| | a* | -3.46 | 0.03 |
| | b* | -0.65 | -4.21 |
| A[vis] (100-TT-Rf) | | 10.09 | 9.44 |
| IGU Optics (Ill 'C', 2 deg obs) | | | |
| T | Y (%) | 76.7 | 78 |
| | a* | -1.67 | -2.13 |
| | b* | 0.22 | 1.31 |
| Rg | Y (%) | 11.3 | 11.4 |
| | a* | -1.72 | -0.79 |
| | b* | -3.59 | -4.89 |
| Rf | Y (%) | 12.5 | 11.8 |
| | a* | -2.06 | -0.46 |
| | b* | -0.68 | -2.25 |
| $R_s$ (ohms/sq) | | 4.16 | 4.30 |
| Normal Emissivity ($E_n$) | | 0.043 | 0.045 |
| Haze (%) | | 0.05 | 0.08 |
| NFRC 2001 Thermal Performance | Tvis (%) | 76.8 | 78 |
| | Tsol (%) | 54.8 | 55.2 |
| | g(3) | 65.5 | 65.2 |
| | g(2) | 58.5 | 58.9 |
| | Uval | 1.19 | 1.198 |
| | LSG(3) | 1.17 | 1.2 |
| | LSG(2) | 1.31 | 1.33 |

Fig. 5

|  | | Example 2 | | Example 3 | |
|---|---|---|---|---|---|
|  | | AE-01-03 | | AE-01-05 | |
| Mono | A[vis] (100-TT-Rf) | AC | HT | AC | HT |
|  |  | 9.77 | 7.23 | 8.94 | 7.14 |
|  | Rs (ohms/sq) | 5.645 | 4.864 | 5.375 | 4.303 |
|  | Normal Emissivity (EN) | 0.062 | 0.058 | 0.059 | 0.047 |
|  | Haze (%) | 0.11 | 0.78 | 0.09 | 0.62 |
| HT - AC | Rf ΔE* | 1.01 | | 2.27 | |
|  | Rg ΔE* | 1.93 | | 1.38 | |
|  | T ΔE* | 1.37 | | 1.20 | |
|  | T |Δb*| | 0.28 | | 0.26 | |
|  | T ΔY% (HT > AC) | 2.98 | | 2.64 | |

|  |  | Example 4 | | Example 5 | |
|---|---|---|---|---|---|
|  |  | AD-95-03 | | AD-95-04 | |
|  |  | AC | HT | AC | HT |
| Mono | T \| Y (%) | 82.84 | 85.06 | 82.67 | 84.16 |
|  | A [vis] (100-TT-Rf) | 9.09 | 7.55 | 9.37 | 8.7 |
| Rs (ohms/sq) | | | 4.86 | | 6.29 |
| Normal Emissivity (EN) | | 0.058 | 0.056 | 0.057 | 0.070 |
| Haze (%) | | 0.11 | 0.59 | 0.15 | 0.91 |
| HT - AC | Rf ΔE* | 2.58 | | 3.29 | |
|  | Rg ΔE* | 1.73 | | 1.73 | |
|  | Rg ΔC* | 1.68 | | 1.71 | |
|  | T ΔE* | 1.08 | | 1.01 | |
|  | T \|Δb*\| | 0.27 | | 0.63 | |
|  | T ΔY% (HT > AC) | 2.22 | | 1.49 | |

COATED ARTICLE HAVING LOW-E COATING WITH IR REFLECTING LAYER(S) AND HAFNIUM INCLUSIVE HIGH INDEX NITRIDED DIELECTRIC LAYER

This application relates to a coated article including a low emissivity (low-E) coating having at least one infrared (IR) reflecting layer of a material such as silver, gold, or the like, and at least one hafnium (Hf) inclusive high index nitrided dielectric layer. In certain example embodiments, the hafnium inclusive high index nitrided dielectric layer(s) may be of or include one or more of HfSiAlN, HfZrSiAlN, HfSiN, HfAlN, and/or HfAlZrN. The high index layer may be a transparent dielectric high index layer, with a high refractive index (n) and low k value, in preferred embodiments and may be provided for antireflection purposes and/or visible transmission purposes, and/or for improving thermal stability. In certain example embodiments, the low-E coating may be used in applications such as monolithic or insulating glass (IG) window units, vehicle windows, or the like.

BACKGROUND AND SUMMARY OF EXAMPLE EMBODIMENTS OF THE INVENTION

Coated articles are known in the art for use in window applications such as insulating glass (IG) window units, vehicle windows, monolithic windows, and/or the like.

Conventional low-E coatings are disclosed, for example and without limitation, in U.S. Pat. Nos. 6,576,349, 9,212,417, 9,297,197, 7,390,572, 7,153,579, and 9,403,345, the disclosures of which are hereby incorporated herein by reference.

Certain low-E coating utilize at least one transparent dielectric layer of titanium oxide (e.g., $TiO_2$), which has a high refractive index (n), for antireflection and/or coloration purposes. See for example U.S. Pat. Nos. 9,212,417, 9,297,197, 7,390,572, 7,153,579, and 9,403,345. Although high refractive index dielectric materials such as $TiO_2$ are known and used in low-E coatings, these materials are not thermally stable and are typically not heat stable after tempering process of about 650 C for 8 minutes, due to film crystallization (or change in crystallinity) in as-deposited or post-tempering state, which may in turn induce thermal or lattice stress on adjacent layers in the film stack. Such stress can further cause change in physical or material properties of the stack and hence impact on the Ag layer, which results in deteriorated low E stack performance. Moreover, $TiO_2$ dielectric layers in low-E coatings suffer from having a very low deposition rate during sputter-deposition of low-E coatings, thereby leading to significantly high costs associated with making low-E coatings.

Example embodiments of this invention solve these problems by providing a high index (high refractive index value n, measured at 550 nm) and low absorption (low k value, measured at 400 nm) hafnium (Hf) inclusive nitrided dielectric layer for use in low-E coatings. Unlike $TiO_2$ dielectric layers, the high index hafnium inclusive dielectric layers herein have been found to be heat treatable so as to be substantially thermally stable upon heat treatment (HT), and can be sputter-deposited at much higher sputter-deposition rates than can $TiO_2$. In certain example embodiments, the hafnium inclusive high index nitrided dielectric layer(s) may be of or include one or more of HfSiAlN, HfZrSiAlN, HfSiN, HfAlN, and/or HfAlZrN. It has been found that adding Hf to ZrSiAlN for example allows widening of its band-gap, and thus lowers considerably the optical absorption (k) while having a high refractive index (n). The same applies to adding Hf to ZrSiN, SiN and SiAlN in certain example embodiments. These materials have also been found to be heat stable (e.g., the variation of refractive index n may be no greater than 0.1 due to HT such as thermal tempering at about 650° C.). In certain example embodiments, it has been found that using a Hf inclusive dielectric layer (instead of a $TiO_2$ dielectric layer) surprisingly results in an increase in visible transmission for the coated article. In certain example embodiments, the low-E coating may be used in applications such as monolithic or insulating glass (IG) window units, vehicle windows, or the like. While Hf inclusive high index nitrided dielectric layers discussed herein are preferably used in low-E coatings, this invention is not so limited and these layers may be used in other thin film coatings such as for high index layers in antireflective (AR) coatings.

"Heat treatment" (HT) and like terms such as "heat treating" and "heat treated", such as thermal tempering, heat strengthening, and/or heat bending, as used herein means heat treating the glass substrate and coating thereon at temperature of at least 580 degrees C. for at least 5 minutes. An example heat treatment is heat treating at temperature of about 600-650 degrees C. for at least 8 minutes.

In an example embodiment of this invention, there is provided a coated article including a coating supported by a glass substrate, the coating comprising: a first dielectric layer on the glass substrate; an infrared (IR) reflecting layer comprising silver on the glass substrate, located over at least the first dielectric layer; a second dielectric layer on the glass substrate, located over at least the IR reflecting layer; and wherein at least one of the first and second dielectric layers comprises a nitride of hafnium (Hf), contains from 0-10% oxygen (atomic %), has a refractive index (n) of at least 2.21 at 550 nm, and further comprises at least one of Zr, Si, and Al.

In another example embodiment of this invention, there is provided a coated article including a coating supported by a glass substrate, the coating comprising: a first dielectric layer on the glass substrate; an infrared (IR) reflecting layer on the glass substrate, located over at least the first dielectric layer; a second dielectric layer on the glass substrate, located over at least the IR reflecting layer; a third dielectric layer on the glass substrate and located over at least the first and second dielectric layers; and wherein at least one of the first and second dielectric layers comprises a nitride of hafnium (Hf), and further comprises at least one of Zr, Si, and Al.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

FIG. 5 is a chart setting forth optical/thermal data for the coated articles of Example 1 according to a preferred embodiment of this invention, and Comparative Example 1 (CE1).

FIG. 6 is a chart setting forth optical/thermal data for the coated articles of Examples 2 and 3 according to preferred embodiments of this invention.

FIG. 9 is a chart setting forth optical/thermal data for the coated articles of Examples 4 and 5 according to preferred embodiments of this invention.

DETAILED DESCRIPTION OF EXAMPLE EMBODIMENTS OF THE INVENTION

Figure 1:
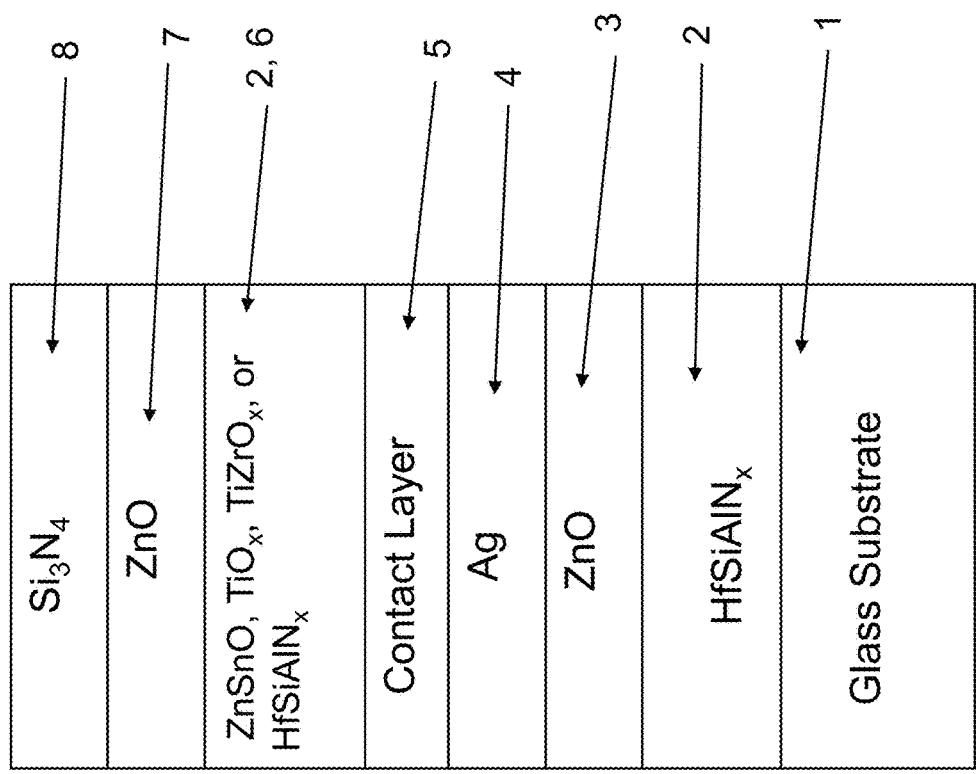
FIG. 1 is a cross sectional view of a coated article according to an example embodiment of this invention.

Referring now to the drawings in which like reference numerals indicate like parts throughout the several views.

Coated articles herein may be used in applications such as monolithic windows, IG window units such as residential windows, patio doors, vehicle windows, and/or any other suitable application that includes single or multiple substrates such as glass substrates.

Conventional high refractive index material such as $TiO_2$ with low or no light absorption in the visible range is often used in low-E coatings in window applications. However, $TiO_2$ is typically not heat stable after a thermal tempering process such as involving HT at about 650 C for 8 minutes, due to film crystallization (or change in crystallinity) in as-deposited or post-tempering state, which may in turn induce thermal or lattice stress on adjacent layers in the film stack. Such a stress can further cause change in physical or material properties of the stack and hence impact on the IR reflecting Ag based layer, which results in deteriorated low E stack performance. $TiO_2$ layers also suffer from a very low sputter-deposition rate.

Figure 4:
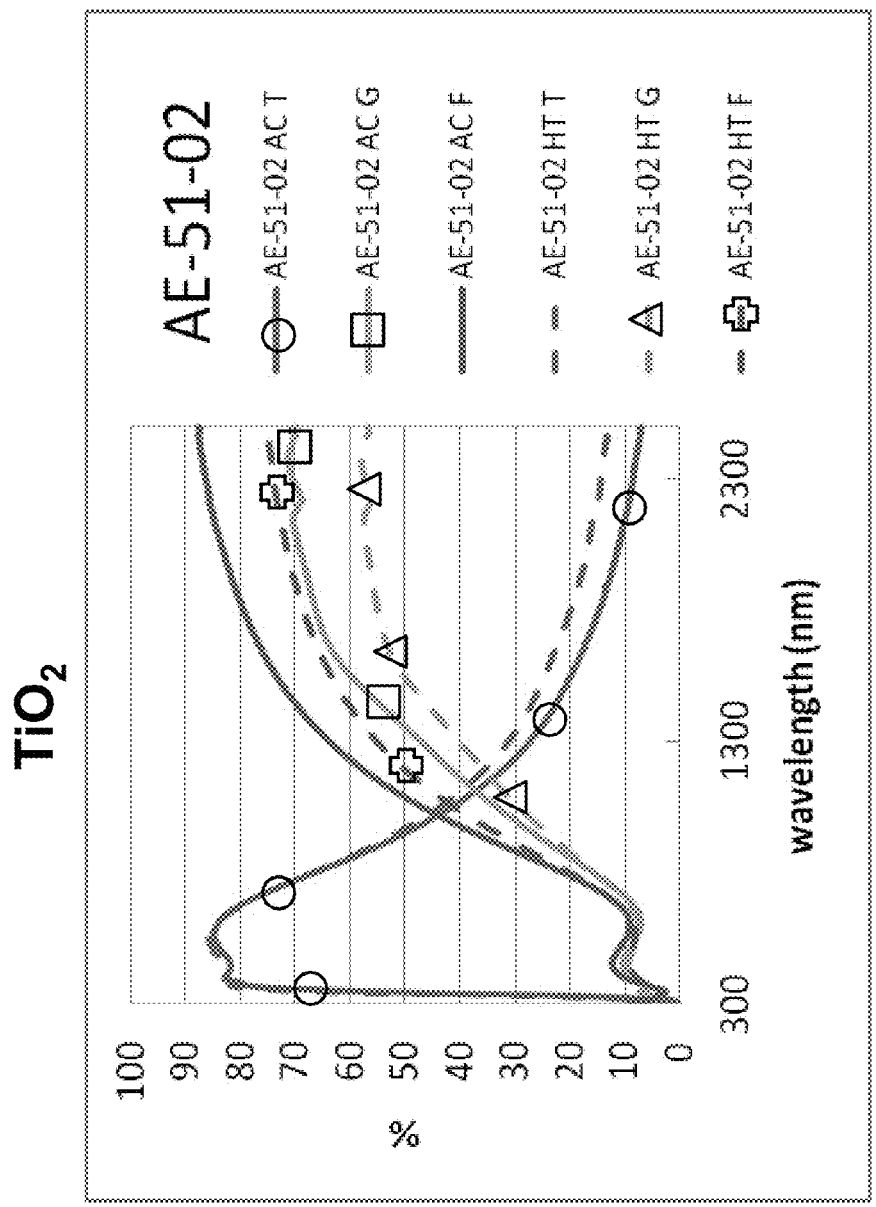
FIG. 4 is a percentage (%) versus wavelength (nm) graph plotting transmission (T) %, glass side reflection (G) %, and film side reflection (F) % of a layer stack including a high index $TiO_2$ layer versus wavelength (nm) in both as-coated (AC) and post-HT (HT) states.

FIG. 4 illustrates that $TiO_2$ is not thermally stable, and thus is not heat treatable from a practical point of view. FIG. 4 is a percentage (%) versus wavelength (nm) graph plotting transmission (T) %, glass side reflection (G) %, and film side reflection (F) % of a layer stack including a high index titanium oxide layer versus wavelength (nm) in both as-coated (AC) and post-HT states. The layer stack was glass/$TiO_2$ (27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al in this Comparative Example 2 (CE 2) stack. Thus, the AC curves are prior to HT, and the HT curves are after heat treatment at about 650 degrees C. for about eight minutes. In FIG. 4, at the right side where the curves are listed, the top three are as coated (AC) which means prior to the HT, and the bottom three are following the heat treatment and thus are labeled "HT." FIG. 4 shows that the layer stack with the crystalline $TiO_2$ is not thermally stable and thus not practically heat treatable. In particular, Comparative Example 2 (CE2) of FIG. 4 shows a significant shift in the IR range of the transmission and reflectance spectra, and increases in emissivity and haze were also found. In FIG. 4, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability.

Example embodiments of this invention solve these problems by providing a high index (high refractive index value n, measured at 550 nm) and low absorption (low k value, measured at 400 nm) hafnium (Hf) inclusive nitrided dielectric layer 2 (and possibly layer 6) for use in low-E coatings. Unlike $TiO_2$ dielectric layers, the high index hafnium inclusive dielectric layers 2 (and possibly 6) herein have been found to be heat treatable so as to be substantially thermally stable upon heat treatment (HT), are amorphous or substantially amorphous, and can be sputter-deposited at much higher sputter-deposition rates than can $TiO_2$. In certain example embodiments, the hafnium inclusive high index nitrided dielectric layer(s) 2 (and possibly 6) may be of or include one or more of HfSiAlN, HfZrSiAlN, HfSiN, HfAlN, and/or HfAlZrN (in various stoichiometries). The chemical representations herein where any of Hf, Zr, and/or N is/are included are provided for purposes of simplicity and understanding, and are not necessarily stoichiometric. For example, HfSiAlN does not mean that equal amounts of Hf, Si, Al and N are provided. Instead, for example and without limitation, an HfSiAlN layer may include more Si than Hf, more Si than Al, and so forth. As another example, SiN can be any suitable stoichiometry, with an example being $Si_3N_4$.

It has been found that adding Hf to SiAlN, SiN, and ZrSiAlN for example allows widening of its band-gap, and thus lowers considerably the optical absorption (k) while having a high refractive index (n). These materials have also been found to be heat stable (e.g., the variation of refractive index n may be low due to HT such as thermal tempering at about 650° C.). In certain example embodiments, the low-E coating may be used in applications such as monolithic or insulating glass (IG) window units, vehicle windows, or the like. While Hf inclusive high index nitrided dielectric layers discussed herein are preferably used in low-E coatings, this invention is not so limited and these layers may be used in other thin film coatings such as for high index layers in antireflective (AR) coatings.

ZrSiAlN exhibits an absorption coefficient k that can be too large for certain optical coating applications. In certain embodiments of this invention, it has been found that adding amounts of Hf to SiAlN, SiN, and ZrSiAlN allows widening of its band-gap, and thus lowers considerably the optical absorption while providing a high refractive index. The extinction coefficient k at a wavelength of about 400 nm (3.1 eV) in these nitrides is related to their band-gap. Photons with wavelengths around 400 nm cannot reasonably be absorbed in materials with bandgaps higher than 3.1 eV, leading to low or no absorption. On the other hand, bandgaps around 3.1 eV or lower lead to significant optical absorption. The width of the band-gap correlates with the difference in electronegativity between the metal element and nitrogen. Hf exhibits a high difference in electronegativity with a value of 1.16 (N=3.04), which allows it to increase the bandgap of SiAlN, SiN, and ZrSiAlN when added thereto, and thus lower absorption thereby increasing transmission. We have found that adding Hf to these nitrides leads to a thermally stable high refractive index nitride with lower optical absorption and thus higher transmission, that can withstand heat treatment (HT) such as thermal tempering.

In certain example embodiments of this invention, hafnium inclusive high index nitrided dielectric layer(s) 2 (and possibly 6) of or including HfSiAlN, HfZrSiAlN, HfSiN, HfAlN, and/or HfAlZrN may have a high refractive index (n) of at least 2.21, more preferably of at least 2.25, even more preferably of at least 2.30 (at 550 nm), and a low absorption coefficient (k) of no greater than 0.02, more preferably no greater than 0.015, even more preferably no greater than 0.010 (at 400 nm). In addition, coated articles according to example embodiments of this invention are thermally stable, and realize a refractive index (n) change after 650° C. heat treatment for 8 minutes of no more than 0.10, more preferably no more than 0.04, and most preferably no more than 0.01. Such hafnium inclusive high index nitrided dielectric layer(s) of or including HfSiAlN, HfZrSiAlN, HfSiN, HfAlN, and/or HfAlZrN may be used to replace high index $TiO_2$ or niobium oxide (e.g., $Nb_2O_5$) layers in any low-E or AR coating stack in example embodiments of this invention, in order to realize advantages discussed herein.

An example metal content of a HfZrSiAlN layer is as following with respect to atomic ratio: Hf:Zr:Si:Al→31.3:31.3:6.7:30.7. In other words, Hf made up 31.3%, Zr made up 31.3%, Si made up 6.7%, and Al made up 30.7% of the metal content of the nitrided layer in terms of atomic %. Thus, this example had equal amounts of Hf and Zr, and an amount of Al between the low 6.7 Si content and each of the Hf and Zr contents. In certain example embodiments when both Hf and Zr are included, the metal content of Hf and Zr combined adds up to from about 45-75% of the metal content of the layer, more preferably from 50-70% of the metal content of the layer. In another example embodiment, metal content of an HfSiAlN layer 2 and/or 6 is made up of 62.6% Hf, 6.7% Si, and 30.7% Al (atomic %). In certain example embodiments of this invention, metal content of the hafnium inclusive high index nitrided dielectric layer 2 and/or 6, of or including one or more of HfSiAlN, HfZrSiAlN, HfSiN, HfAlN, and/or HfAlZrN, may contain one or more of: (i) from 10-75% Hf, more preferably from 20-70% Hf, even more preferably from 20-50% Hf, possibly from 25-40% Hf (atomic %); (ii) from 0-50% Zr, more preferably from 1-40% Zr, even more preferably from 10-40% Zr, and most preferably from 20-40% Zr (atomic %); (iii) from 2-50% Si, more preferably from 3-20% Si, even more preferably from 4-15% Si (atomic %); and/or (iv) from 0-60% Al, more preferably from 1-45% Al, even more preferably from 10-40% Al, and most preferably from 20-40% Al (atomic %). Note that Si is considered a metal herein. In certain example embodiments, the Hf-inclusive layer contains more Hf than Si, such as at least 10% more Si than Hf, more preferably at least 25% more Hf than Si, and most preferably at least 35% more Hf than Si in terms of atomic %. In certain example embodiments, Hf has the highest atomic % metal content of any metal in layer 2 and/or 6 when the layer comprises a nitride of Hf such as HfSiAlN, HfZrSiAlN, HfSiN, HfAlN, and/or HfAlZrN.

The metal content of the hafnium inclusive high index nitrided dielectric layer 2 and/or 6, of or including one or more of HfSiAlN, HfZrSiAlN, HfSiN, HfAlN, and/or HfAlZrN, is preferably free of, or substantially free of, Ti and/or Nb. The layer 2 and/or 6 comprising the nitride of Hf may contain from 0-10% of Ti, more preferably from 0-5% Ti, and most preferably from 0-2% of Ti (atomic %). The layer 2 and/or 6 comprising the nitride of Hf may contain from 0-10% of Nb, more preferably from 0-5% Nb, and most preferably from 0-2% of Nb.

While oxygen is not preferred in hafnium inclusive high index nitrided dielectric layer(s) 2 (and possibly 6) of or including HfSiAlN, HfZrSiAlN, HfSiN, HfAlN, and/or HfAlZrN discussed herein, it is possible that these layers may contain a small amount of oxygen. For example, hafnium inclusive high index nitrided dielectric layer(s) 2 (and possibly 6) of or including HfSiAlN, HfZrSiAlN, HfSiN, HfAlN, and/or HfAlZrN may contain from 0-10% oxygen more preferably from 0-5% oxygen, and most preferably from 0-2% oxygen (atomic %).

In certain example embodiments of this invention, metal content of a hafnium inclusive high index nitrided dielectric layer 2 and/or 6, of or including HfAlZrN may contain more Al than Hf. For example it has been found that a layer of or including HfAlZrN is able to realize significant higher refractive index, desirably low k value, and heat treability with a small amount of Hf. For example, in certain example embodiments, a HfAlZrN or HfAlN layer may contain at least twice as much Al as Hf, sometimes at least three times as much Al as Hf. The amorphous properties provide for heat-stable materials. This material remains amorphous even though at the post heat-treatment of 650 C. In certain example embodiments, there is more Al than each of Hf and Zr, for example at least twice as much Al as each of Hf and Zr, and the layer may contain more Hf than Zr, such as at least two or three times as much Hf as Zr (atomic percentages). An example layer may have the following material ratio: Al:Hf:Zr:Si→1:0.3:0.06:0.2 (atomic ratio), where Si is optional. In addition, Al:Hf:Zr:N materials have a sputter deposition rate that is much higher than titanium oxide, which is advantageous as discussed herein. In sum, HfAlZrN for layer 2 and/or 6 has excellent properties such as high refractive index, low absorption, and thermal stability, where aluminum is the dominate element that may be more than 3 times content of other metal elements.

FIG. 1 is a cross sectional view of a coated article according to an example embodiment of this invention. The coated article includes glass substrate 1 (e.g., clear, green, bronze, or blue-green glass substrate from about 1.0 to 10.0 mm thick, more preferably from about 1.0 mm to 6.0 mm thick), and a multi-layer coating (or layer system) provided on the substrate 1 either directly or indirectly. The example low-E coating according to the FIG. 1 embodiment may hafnium inclusive high index nitrided dielectric layer(s) 2 of or including HfSiAlN, HfZrSiAlN, HfSiN, HfAlN, and/or HfAlZrN as discussed herein, zinc oxide and/or zinc stannate inclusive contact layer 3 (e.g., $ZnO_x$ where "x" may be about 1; or $ZnAlO_x$), IR (infrared) reflecting layer 4 including or of silver, gold, or the like, upper contact layer 5 of or including an oxide of Ni and/or Cr (e.g., $NiCrO_x$) or other suitable material, and a dielectric overcoat of or including dielectric layer 6 that may be a medium index layer such as zinc oxide or zinc stannate, or may be a high index layer such titanium oxide (e.g., $TiO_2$), zirconium-doped titanium oxide, or a hafnium inclusive high index nitrided dielectric layer of or including HfSiAlN, HfZrSiAlN, HfSiN, HfAlN, and/or HfAlZrN discussed herein, optional medium index layer 7 of or including zinc oxide, tin oxide, silicon nitride, and/or zinc stannate or other suitable material, and dielectric layer 8 of or including silicon nitride and/or silicon oxynitride or other suitable material. The silicon nitride layers (e.g., layer 8) may further include Al, oxygen, or the like, and the zinc oxide based layers may also include tin and/or aluminum. Other layers and/or materials may also be provided in the coating in certain example embodiments of this invention, and it is also possible that certain layers may be removed or split in certain example instances. For example, the overcoat may include a zirconium oxide layer or an AlSiBO$_x$ layer (not shown) could be provided directly over and contacting silicon nitride layer 8. As another example, another medium index layer such as silicon nitride could be provided between the glass substrate 1 and high index layer 2. As another example, two silver based IR reflecting layers, spaced apart by a dielectric layer stack including tin oxide for instance, may be provided and the overcoat and/or undercoat of FIG. 1 may be used therein. Moreover, one or more of the layers discussed above may be doped with other materials in certain example embodiments of this invention. This invention is not limited to the layer stack shown in FIG. 1, as the FIG. 1 stack is provided for purposes of example only in order to illustrate an example location(s) for high index Hf inclusive layer 2 (and possibly 6) discussed herein.

In monolithic instances, the coated article includes only one substrate such as glass substrate 1 (see FIG. 1). However, monolithic coated articles herein may be used in devices such as IG window units for example. Typically, an IG window unit may include two or more spaced apart substrates with an air gap defined therebetween. Example IG window units are illustrated and described, for example, in U.S. Pat. Nos. 5,770,321, 5,800,933, 6,524,714, 6,541,084 and US 2003/0150711, the disclosures of which are all hereby incorporated herein by reference. For example, the coated glass substrate shown in FIG. 1 may be coupled to another glass substrate via spacer(s), sealant(s) or the like with a gap being defined therebetween in an IG window unit. In certain example instances, the coating may be provided on the side of the glass substrate 1 facing the gap, i.e., surface #2 or surface #3. In other example embodiments, the IG window unit may include additional glass sheets (e.g., the IG unit may include three spaced apart glass sheets instead of two).

Transparent dielectric lower contact layer 3 may be of or include zinc oxide (e.g., ZnO), zinc stannate, or other suitable material. The zinc oxide of layer 3 may contain other materials as well such as Al (e.g., to form ZnAlO$_x$) or Sn in certain example embodiments. For example, in certain example embodiments of this invention, zinc oxide layer 3 may be doped with from about 1 to 10% Al (or B), more preferably from about 1 to 5% Al (or B), and most preferably about 2 to 4% Al (or B). The use of zinc oxide 3 under the silver in layer 4 allows for an excellent quality of silver to be achieved. Zinc oxide layer 3 is typically deposited in a crystalline state. In certain example embodiments (e.g., to be discussed below) the zinc oxide inclusive layer 3 may be formed via sputtering a ceramic ZnO or metal rotatable magnetron sputtering target.

Infrared (IR) reflecting layer 4 is preferably substantially or entirely metallic and/or conductive, and may comprise or consist essentially of silver (Ag), gold, or any other suitable IR reflecting material. The silver of IR reflecting layer 4 may be doped with other material(s), such as with Pd, Zn, or Cu, in certain example embodiments. IR reflecting layer 4 helps allow the coating to have low-E and/or good solar control characteristics such as low emittance, low sheet resistance, and so forth. The IR reflecting layer may, however, be slightly oxidized in certain embodiments of this invention. Multiple silver based IR reflecting layers 4 may be provided, spaced apart in low-E coating by at least one dielectric layer, in double or triple silver stacks including high index layers discussed herein in certain example embodiments of this invention.

Upper contact layer 5 is located over and directly contacting the IR reflecting layer 4, and may be of or include an oxide of Ni and/or Cr in certain example embodiments. In certain example embodiments, upper contact layer 5 may be of or include nickel (Ni) oxide, chromium/chrome (Cr) oxide, or a nickel alloy oxide such as nickel chrome oxide (NiCrO$_x$), or other suitable material(s) such as NiCrMoO$_x$, NiCrMo, Ti, NiTiNbO$_x$, TiO$_x$, metallic NiCr, or the like. Contact layer 5 may or may not be oxidation graded in different embodiments of this invention. Oxidation grading means that the degree of oxidation in the layer changes through the thickness of the layer so that for example a contact layer may be graded so as to be less oxidized at the contact interface with the immediately adjacent IR reflecting layer 4 than at a portion of the contact layer further or more/most distant from the immediately adjacent IR reflecting layer. Contact layer 5 may or may not be continuous in different embodiments of this invention across the entire IR reflecting layer 4.

Other layer(s) below or above the illustrated FIG. 1 coating may also be provided. Thus, while the layer system or coating is "on" or "supported by" substrate 1 (directly or indirectly), other layer(s) may be provided therebetween. Thus, for example, the coating of FIG. 1 may be considered "on" and "supported by" the substrate 1 even if other layer(s) are provided between layer 2 and substrate 1. Moreover, certain layers of the illustrated coating may be removed in certain embodiments, while others may be added between the various layers or the various layer(s) may be split with other layer(s) added between the split sections in other embodiments of this invention without departing from the overall spirit of certain embodiments of this invention.

While various thicknesses may be used in different embodiments of this invention, example thicknesses and materials for the respective layers on the glass substrate 1 in the FIG. 1 embodiment may be as follows, from the glass substrate outwardly (e.g., the Al content in the zinc oxide and silicon nitride layers may be from about 1-10%, more preferably from about 1-5% in certain example instances). Thickness are in units of angstroms (A).

TABLE 1

(Example Materials/Thicknesses; FIG. 1 Embodiment)

| Layer | Preferred Range (Å) | More Preferred (Å) | Example (Å) |
|---|---|---|---|
| Hf-inclusive (layer 2) | 40-500 Å | 150-350 Å | 270 Å |
| ZnO or ZnAlO$_x$ (layer 3) | 10-240 Å | 35-120 Å | 40 Å |
| Ag (layer 4) | 40-160 Å | 65-125 Å | 110 Å |
| Contact (layer 5) | 10-70 Å | 20-50 Å | 34 Å |
| Layer 6 | 30-350 Å | 80-200 Å | 100 Å |
| ZnO or ZnAlO$_x$ or SiN (layer 7) | 10-240 Å | 35-120 Å | 40 Å |
| Si$_x$N$_y$ (layer 8) | 50-250 Å | 80-180 Å | 100 Å |

In certain example embodiments of this invention, coated articles herein (e.g., see FIG. 1) may have the following low-E (low emissivity), solar and/or optical characteristics set forth in Table 2 when measured monolithically.

TABLE 2

Low-E/Solar Characteristics (Monolithic)

| Characteristic | General | More Preferred | Most Preferred |
|---|---|---|---|
| $R_s$ (ohms/sq.): | <=11.0 | <=10 | <=9 |
| $E_n$: | <=0.2 | <=0.15 | <=0.10 |
| $T_{vis}$ (%): | >=50 | >=60 | >=70 |

While high index transparent dielectric Hf-inclusive layer 2 (and possibly 6) is shown and described in connection with the low-E coating of FIG. 1 above, this invention is not so limited. Hafnium inclusive high index nitrided dielectric layer 2 (and possibly 6) of or including HfSiAlN, HfZrSiAlN, HfSiN, HfAlN, and/or HfAlZrN described herein may be used as a high index layer(s) in any suitable low-E coating either above or below an IR reflecting layer(s). One or more of such hafnium inclusive high index nitrided dielectric layer(s) of or including HfSiAlN, HfZrSiAlN, HfSiN, HfAlN, and/or HfAlZrN may be provided in any suitable low-E coating. For example and without limitation, hafnium inclusive high index nitrided dielectric layers discussed herein of or including HfSiAlN, HfZrSiAlN, HfSiN, HfAlN, and/or HfAlZrN may be used to replace any high index (e.g., $TiO_x$ or $TiO_2$) layer in any of the low-E coatings in any of U.S. Pat. Nos. 9,212,417, 9,297,197, 7,390,572, 7,153,579, 9,365,450, and 9,403,345, all of which are incorporated herein by reference.

Figure 2:
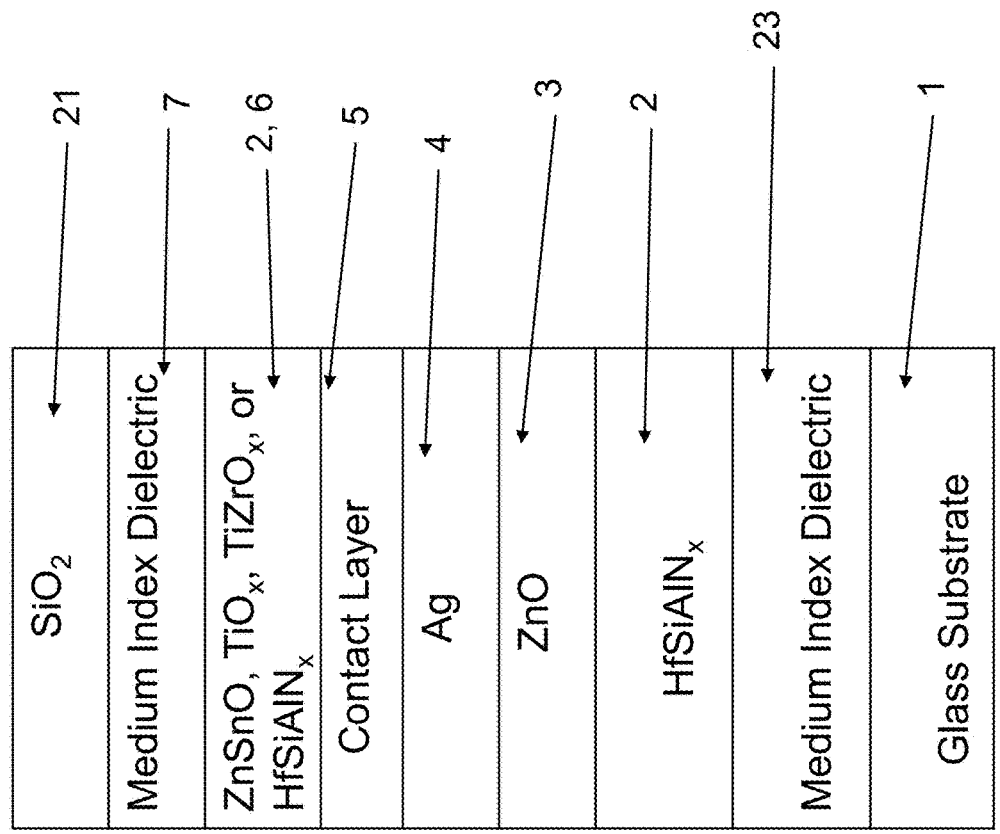
FIG. 2 is a cross sectional view of a coated article according to another example embodiment of this invention.

FIG. 2 is a cross sectional view of a coated article according to another example embodiment of this invention. FIG. 2 is similar to FIG. 1 discussed above, except that in the FIG. 2 embodiment a medium index (n) layer 23 of or including material such as silicon nitride or zinc oxide is provided between and directly contacting the glass substrate 1 and the Hf inclusive high index layer 2, and a low index layer 21 of a material such as $SiO_2$ is provided in place of layer 8.

Figure 3:
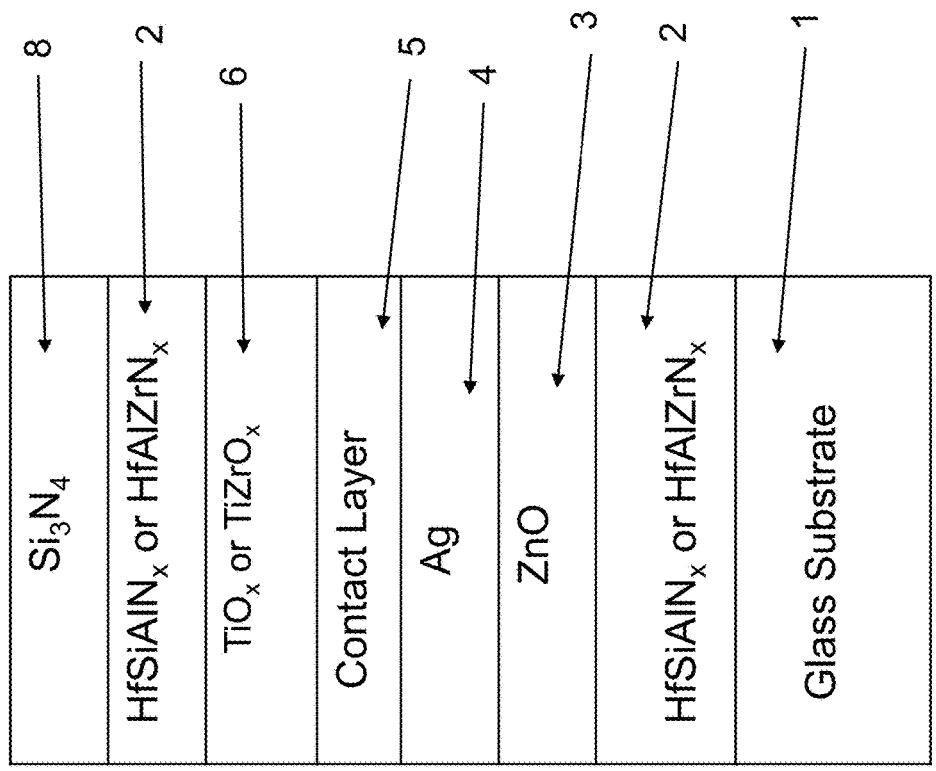
FIG. 3 is a cross sectional view of a coated article according to another example embodiment of this invention.

FIG. 3 is a cross sectional view of a coated article according to another example embodiment of this invention. FIG. 3 is similar to FIG. 1 discussed above, except that two high index layers 2 and 6 are provided in the overcoat and layer 7 from FIG. 1 is omitted in the FIG. 3 embodiment. In the overcoat in FIG. 3, layer 2 is an Hf-inclusive high index layer of or including HfSiAlN, HfZrSiAlN, HfSiN, HfAlN, and/or HfAlZrN as discussed herein and layer 6 is of or including titanium oxide (e.g., $TiO_2$) which may or may not be doped.

Examples according to certain example embodiments of this invention, and two Comparative Examples (CEs), discussed below.

Example 1

Example 1 and Comparative Example (CE) 1 had respective layer stack as follows, with layer thicknesses in units of nm. The Comparative Example (CE) 1 used a $TiO_2$ high index layer in the lower dielectric section, whereas Example 1 replaced the $TiO_2$ high index layer of CE1 with an HfSiAlN layer 2. Example 1 also replaced much of the $TiO_2$ in the overcoat of CE1 with an HfSiAlN layer. Other than the change in high index materials, CE1 and Example 1 were the same.

| Layer | CE 1 (nm) | Ex. 1 (nm) |
|---|---|---|
| SiN | 20 | 20 |
| HfSiAlN | 0 | 15 |
| $TiO_2$ | 20 | 5 |
| NiCrOx | 1 | 1 |
| Ag | 12.2 | 12.2 |
| ZnAlO | 8 | 8 |
| $TiO_2$ | 30 | 0 |
| HfSiAlN | 0 | 30 |
| glass (3 mm) | | |

FIG. 5 shows the optical/thermal data for the coated article of Example 1 and Comparative Example 1 (CE 1). "AC" in FIG. 5 stands for as coated (i.e., before HT). The performance was excellent for Example 1. The color is nearly neutral, and visible transmission was high and normal emissivity ($E_n$) low. Surprisingly, it can be seen that the replacement of $TiO_2$ of CE1 with HfSiAlN in Example 1 resulted in an increase in visible transmission ($T_{vis}$). In particular, Example 1 had a visible transmission of 78%, whereas CE 1 had a lower visible transmission of 76.7%. Thus, the replacement of $TiO_2$ with HfSiAlN is advantageous in that the HfSiAlN does not significantly adversely affect color, emissivity, or transmission (and can even provide for an increase in visible transmission as shown in FIG. 5), can be deposited in a much faster manner than $TiO_2$, and is amorphous or substantially amorphous as deposited and after HT so as to have significantly improved thermal stability compared to $TiO_2$.

Example 2

Example 2 was a low-E coating on a glass substrate according to a preferred embodiment according to the FIG. 1 embodiment, for comparing to Comparative Example (CE) 2 of FIG. 4. The Example 2 layer stack was similar to the layer stack of the CE2 of FIG. 4, except that the $TiO_2$ layer in the CE2 for FIG. 4 was replaced in Example 2 with a layer of HfSiAlN. The layer stack of Example 2 was glass/HfSiAlN (27 nm)/ZnO (4 nm)/Ag (11 nm)/NiTiNbO$_x$ (2.4 nm)/ZnSnO (10 nm)/ZnO (4 nm)/SiN (10 nm), where the ZnO layers were doped with Al in both Example 2 and the CE2 stacks. In other words, the stacks of Example 2 and CE2 were essentially the same, except for the bottom layer. The HfSiAlN layer in Example 2 was sputter deposited in an atmosphere containing 33 sccm argon gas and 10 sccm nitrogen gas, had a refractive index (n) of 2.29 (at 550 nm) and a k value of 0.022 (at 400 nm). FIG. 6 shows optical/thermal data for Example 2 (and Example 3), both before and after heat treatment. In FIG. 6, "as coated" (AC) which means prior to the HT, and "HT" means after the heat treatment, where the heat treatment was at about 650 degrees C. for about eight minutes in Example 2 (and CE2 and Example 3). Note that thermal stability is demonstrated by the small changes in normal emissivity and sheet resistance due to the heat treatment shown in FIG. 6, with Example 2 even realizing a drop in emissivity and sheet resistance due to the HT which is particularly desirable. In contrast, CE2 realized a significant increase in emissivity upon HT because the titanium oxide layer was not thermally stable in CE2.

Figure 7:
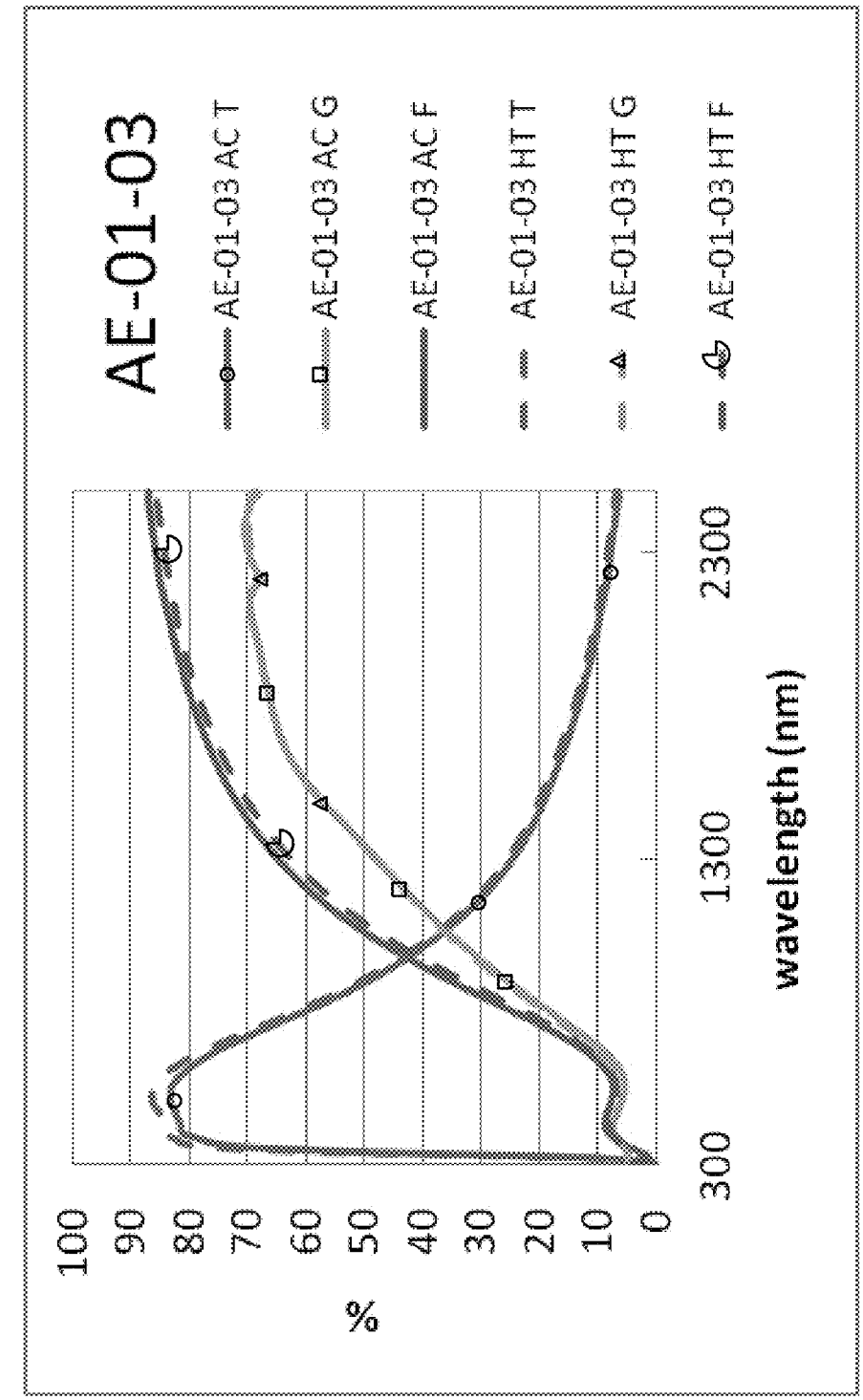
FIG. 7 is a percentage (%) versus wavelength (nm) graph plotting transmission (T) %, glass side reflection (G) %, and film side reflection (F) % of a layer stack including a high index HfSiAlN layer versus wavelength (nm) in both as-coated (AC) and post-HT (HT) states, for Example 2.

FIG. 7 show the data of Example 2, before and after HT, and should be compared to the CE2 of FIG. 4. In FIGS. 4 and 7 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. Comparing FIG. 7 for Example 2 to the Comparative Example (CE2) in FIG. 4, significant unexpected differences are demonstrated resulting from the use of the HfSiAlN layer 2. In FIG. 4 for CE2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE of FIG. 4. The Comparative Example (CE2) of FIG. 4 shows a significant shift in the IR range of the transmission and reflectance spectra, and increases in emissivity and haze were also found. In contrast, upon replacing the titanium oxide layer of the CE2 with the HfSiAlN layer of Example 2, FIG. 7 shows that in the wavelength area from about 1500 to 2400 nm there was very little shift due to HT from the "AC T" (transmission, as coated prior to HT) curve to the "HT T" (transmission, after HT) curve of less than 2%; there was very little shift due to HT from the "AC G" (glass side reflectance, as coated prior to HT) curve to the "HT G" (glass side reflectance, after HT) curve of less than 2%; and there was very little shift due to HT from the "AC F" (film side reflectance, as coated prior to HT) curve to the "HT F" (film side reflectance, after HT) curve of less than 3 or 4%. These much smaller shifts for Example 2 in FIG. 7 (compared to the CE2 of FIG. 4) demonstrate an unexpected improvement in thermal stability and heat treatability of the coating. Accordingly, comparing FIG. 7 to FIG. 4, it can be seen that Example 2 was surprisingly and unexpectedly improved compared to the CE2 with respect to thermal stability and heat treatability (e.g., thermal tempering).

Example 3

Example 3 was similar to Example 2, except for a difference in sputtering gas ratio. Example 3 was a low-E coating on a glass substrate according to a preferred embodiment according to the FIG. 1 embodiment, for comparing to Comparative Example (CE) 2 of FIG. 4. The Example 3 layer stack was similar to the layer stack of the CE2 of FIG. 4, except that the $TiO_2$ layer in the CE2 for FIG. 4 was replaced in Example 3 with a layer of HfSiAlN. The layer stack of Example 3 was glass/HfSiAlN (27 nm)/ZnO (4 nm)/Ag (11 nm)/NiTiNbO$_x$(2.4 nm)/ZnSnO (10 nm)/ZnO (4 nm)/SiN (10 nm), where the ZnO layers were doped with Al in both the Example 3 and CE2 stacks. In other words, the stacks of Example 3 and CE2 were essentially the same, except for the bottom layer. The HfSiAlN layer in Example 3 was sputter deposited in an atmosphere containing 35 sccm argon gas and 8 sccm nitrogen gas (a lower nitrogen ratio than Example 2), had a refractive index (n) of 2.312 (at 550 nm) and a k value of 0.015 (at 400 nm). FIG. 6 shows optical/thermal data for Examples 2-3, both before and after heat treatment. In FIG. 6, "as coated" (AC) which means prior to the HT, and "HT" means after the heat treatment, where the heat treatment was at about 650 degrees C. for about eight minutes in Example 3 (and CE2 and Example 2). Note that thermal stability is demonstrated by the small changes in normal emissivity and sheet resistance due to the heat treatment shown in FIG. 6, with Example 3 even realizing a drop in emissivity and sheet resistance due to the HT which is particularly desirable. In contrast, CE2 realized a significant increase in emissivity upon HT because the titanium oxide layer was not thermally stable in CE2.

Figure 8:
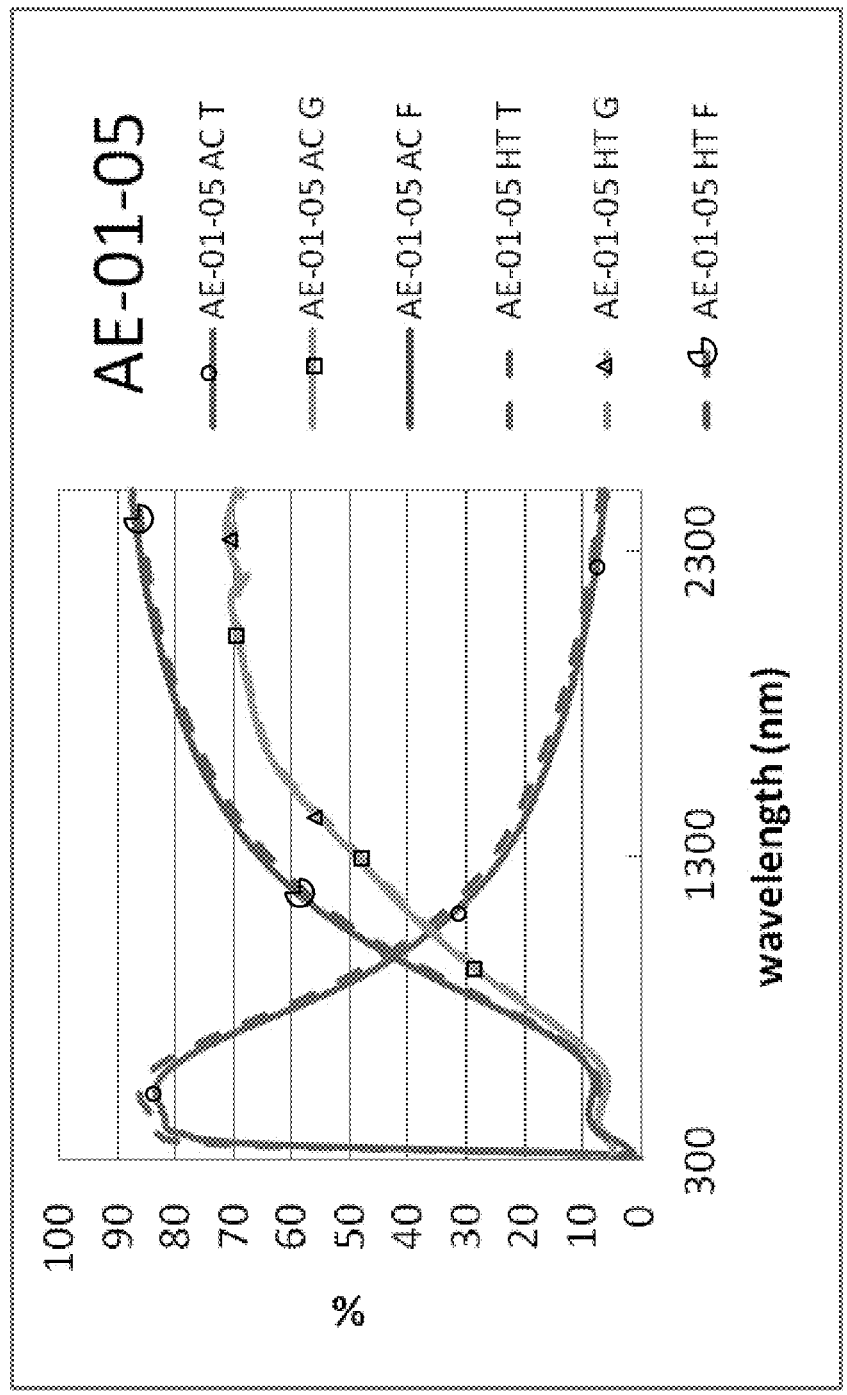
FIG. 8 is a percentage (%) versus wavelength (nm) graph plotting transmission (T) %, glass side reflection (G) %, and film side reflection (F) % of a layer stack including a high index HfSiAlN layer versus wavelength (nm) in both as-coated (AC) and post-HT (HT) states, for Example 3.

FIG. 8 show the data of Example 3, before and after HT, and should be compared to the CE2 of FIG. 4. In FIGS. 4 and 8 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. Comparing FIG. 8 for Example 3 to the Comparative Example (CE2) in FIG. 4, significant unexpected differences are demonstrated resulting from the use of the HfSiAlN layer 2. In FIG. 4 for CE2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE of FIG. 4. The Comparative Example (CE2) of FIG. 4 shows a significant shift in the IR range of the transmission and reflectance spectra, and increases in emissivity and haze were also found. In contrast, upon replacing the titanium oxide layer of the CE2 with the HfSiAlN layer of Example 3, FIG. 8 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 3%; and there was very little shift due to HT from the "AC F" (film side reflectance, as coated prior to HT) curve to the "HT F" (film side reflectance, after HT) curve of less than 3 or 4%. These much smaller shifts for Example 3 in FIG. 8 (compared to the CE2 of FIG. 4) demonstrate an unexpected improvement in thermal stability and heat treatability of the coating. Accordingly, comparing FIG. 8 to FIG. 4, it can be seen that Example 3 was surprisingly and unexpectedly improved compared to the CE2 with respect to thermal stability and heat treatability (e.g., thermal tempering).

Example 4

Example 4 was a low-E coating on a glass substrate according to a preferred embodiment according to the FIG. 1 embodiment, for comparing to Comparative Example (CE) 2 of FIG. 4. The Example 4 layer stack was similar to the layer stack of the CE2 of FIG. 4, except that the $TiO_2$ layer in the CE2 for FIG. 4 was replaced in Example 4 with a layer of HfSiAlN. The layer stack of Example 4 was glass/HfSiAlN (27 nm)/ZnO (4 nm)/Ag (11 nm)/NiTiNbO$_x$ (2.4 nm)/ZnSnO (10 nm)/ZnO (4 nm)/SiN (10 nm), where the ZnO layers were doped with Al in both Example 4 and the CE2 stacks. Thus, the stacks of Example 4 and CE2 were essentially the same, except for the bottom layer. The HfSiAlN layer in Example 4 was sputter deposited in an atmosphere containing 37 sccm argon gas and 6 sccm nitrogen gas, had a refractive index (n) of 2.24 (at 550 nm) and a k value of 0.008 (at 400 nm). FIG. 9 shows optical/thermal data for Example 4 (and Example 5), both before and after heat treatment. In FIG. 9, "as coated" (AC) which means prior to the HT, and "HT" means after the heat treatment, where the heat treatment was at about 650 degrees C. for about eight minutes in Example 4 (and CE2 and Example 5). Note that thermal stability is demonstrated by the small changes in normal emissivity and sheet resistance due to the heat treatment shown in FIG. 9, with Example 4 even realizing a drop in emissivity and sheet resistance due to the HT which is particularly desirable. In contrast, CE2 realized a significant increase in emissivity upon HT because the titanium oxide layer was not thermally stable in CE2.

Figure 10:
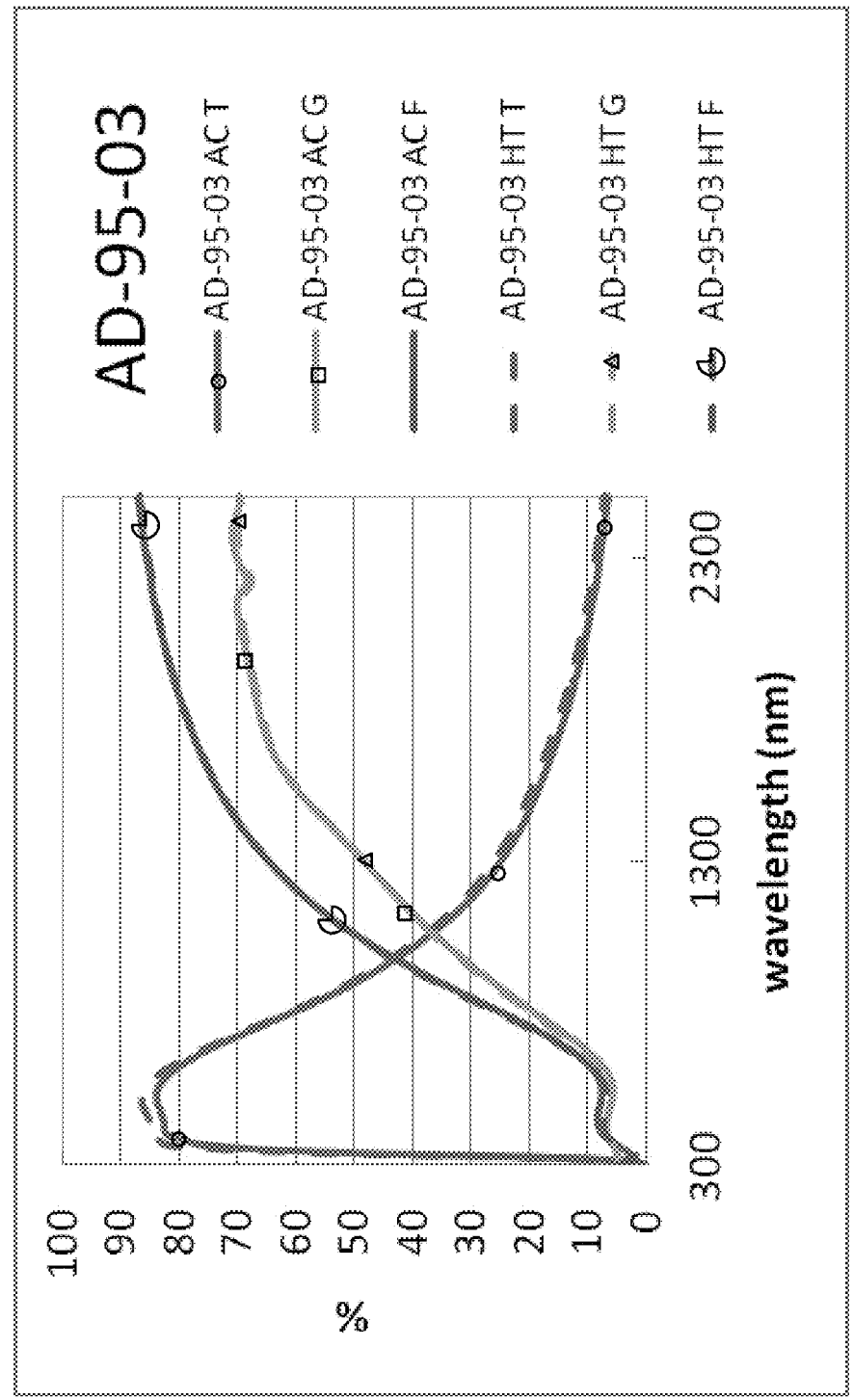
FIG. 10 is a percentage (%) versus wavelength (nm) graph plotting transmission (T) %, glass side reflection (G) %, and film side reflection (F) % of a layer stack including a high index HfSiAlN layer versus wavelength (nm) in both as-coated (AC) and post-HT (HT) states, for Example 4.

FIG. 10 show the data of Example 4, before and after HT, and should be compared to the CE2 of FIG. 4. In FIGS. 4 and 10 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. Comparing FIG. 10 for Example 4 to the Comparative Example (CE2) in FIG. 4, significant unexpected differences are demonstrated resulting from the use of the HfSiAlN layer 2. In FIG. 4 for CE2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE2 of FIG. 4. The Comparative Example (CE2) of FIG. 4 shows a significant shift in the IR range of the transmission and reflectance spectra, and increases in emissivity and haze were also found. In contrast, upon replacing the titanium oxide layer of the CE2 with the HfSiAlN layer of Example 4, FIG. 10 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 3%; and there was very little shift due to HT from the "AC F" (film side reflectance, as coated prior to HT) curve to the "HT F" (film side reflectance, after HT) curve of less than 3%. These much smaller shifts for Example 4 in FIG. 10 (compared to the CE2 of FIG. 4) demonstrate an unexpected improvement in thermal stability and heat treatability of the coating. Accordingly, comparing FIG. 10 to FIG. 4, it can be seen that Example 4 was surprisingly and unexpectedly improved compared to the CE2 with respect to thermal stability and heat treatability (e.g., thermal tempering).

Example 5

Example 5 was a low-E coating on a glass substrate according to a preferred embodiment according to the FIG. 1 embodiment, for comparing to Comparative Example (CE) 2 of FIG. 4. The Example 5 layer stack was similar to the layer stack of the CE2 of FIG. 4, except that the $TiO_2$ layer in the CE2 for FIG. 4 was replaced in Example 5 with a layer of HfAlN. The layer stack of Example 5 was glass/HfAlN (27 nm)/ZnO (4 nm)/Ag (11 nm)/NiTiNbO$_x$ (2.4 nm)/ZnSnO (10 nm)/ZnO (4 nm)/SiN (10 nm), where the ZnO layers were doped with Al in both Example 5 and the CE2 stacks. Thus, the stacks of Example 5 and CE2 were essentially the same, except for the bottom layer. The HfAlN layer in Example 5 was sputter deposited in an atmosphere containing 28 sccm argon gas and 15 sccm nitrogen gas, had a refractive index (n) of 2.25 (at 550 nm) and a k value of 0.007 (at 400 nm). FIG. 9 shows optical/thermal data for Example 5, both before and after heat treatment. In FIG. 9, "as coated" (AC) which means prior to the HT, and "HT" means after the heat treatment, where the heat treatment was at about 650 degrees C. for about eight minutes in Example 5 (and CE2 and Example 4).

Figure 11:
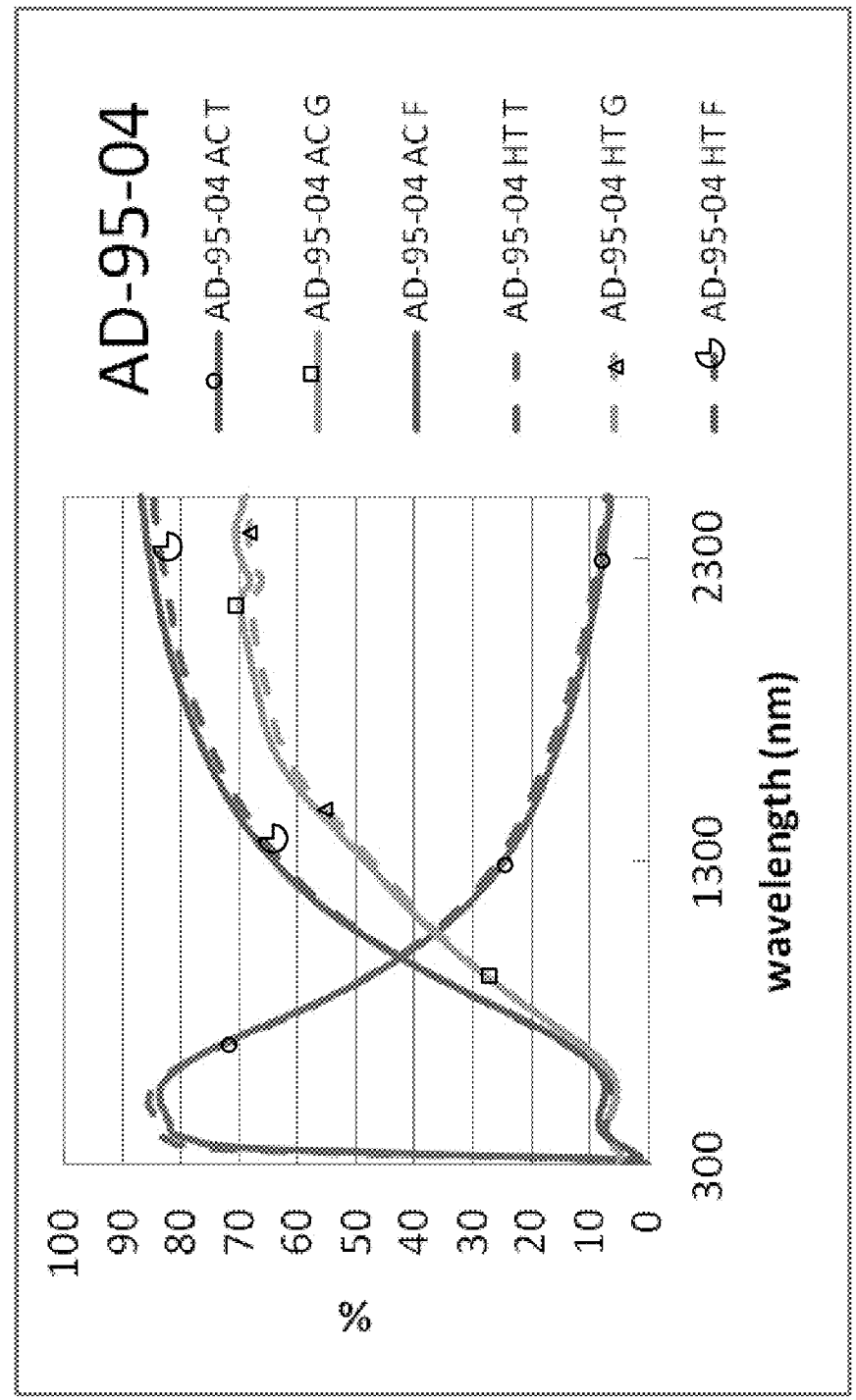
FIG. 11 is a percentage (%) versus wavelength (nm) graph plotting transmission (T) %, glass side reflection (G) %, and film side reflection (F) % of a layer stack including a high index HfAlN layer versus wavelength (nm) in both as-coated (AC) and post-HT (HT) states, for Example 5.

FIG. 11 show the data of Example 5, before and after HT, and should be compared to the CE2 of FIG. 4. In FIGS. 4 and 11 at the right side where the curves are listed, the top three are "as coated" (AC) which means prior to the HT, and the bottom three are following the heat treatment and thus are labeled "HT." Thus, the AC curves are prior to HT, and the HT curves are after heat treatment at about 650 degrees C. for about eight minutes. Comparing FIG. 11 for Example 5 to the Comparative Example (CE2) in FIG. 4, significant unexpected differences are demonstrated resulting from the use of the HfAlN layer 2 of Example 5. In FIG. 4 for CE2, in the wavelength area from about 1500 to 2400 nm, there was a shift due to HT from the "AC T" (transmission, as coated prior to HT) curve to the "HT T" (transmission, after HT) curve of about 6%; there was a shift due to HT from the "AC G" (glass side reflectance, as coated prior to HT) curve to the "HT G" (glass side reflectance, after HT) curve of about 12-14%; and there was a shift due to HT from the "AC F" (film side reflectance, as coated prior to HT) curve to the "HT F" (film side reflectance, after HT) curve of about 12-13%. Overall, taken together in combination, there is a significant shift in transmission and reflection spectra upon HT which indicates a lack of thermal stability for the CE2 of FIG. 4. The Comparative Example (CE2) of FIG. 4 shows a significant shift in the IR range of the transmission and reflectance spectra, and increases in emissivity and haze were also found. In contrast, upon replacing the titanium oxide layer of the CE2 with the HfAlN layer of Example 5, FIG. 11 shows that in the wavelength area from about 1500 to 2400 nm there was very little shift due to HT from the "AC T" (transmission, as coated prior to HT) curve to the "HT T" (transmission, after HT) curve of less than 3%; there was very little shift due to HT from the "AC G" (glass side reflectance, as coated prior to HT) curve to the "HT G" (glass side reflectance, after HT) curve of less than 4%; and there was very little shift due to HT from the "AC F" (film side reflectance, as coated prior to HT) curve to the "HT F" (film side reflectance, after HT) curve of less than 3 or 4%. These much smaller shifts for Example 5 in FIG. 11 (compared to the CE2 of FIG. 4) demonstrate an unexpected improvement in thermal stability and heat treatability of the coating. Accordingly, comparing FIG. 11 to FIG. 4, it can be seen that Example 5 was surprisingly and unexpectedly improved compared to the CE2 with respect to thermal stability and heat treatability (e.g., thermal tempering).

In an example embodiment of this invention, there is provided a coated article including a coating supported by a glass substrate, the coating comprising: a first dielectric layer on the glass substrate; an infrared (IR) reflecting layer comprising silver on the glass substrate, located over at least the first dielectric layer; a second dielectric layer on the glass substrate, located over at least the IR reflecting layer; and wherein at least one of the first and second dielectric layers comprises a nitride of hafnium (Hf), contains from 0-10% oxygen (atomic %), has a refractive index (n) of at least 2.21 at 550 nm, and further comprises at least one of Zr, Si, and Al.

In the coated article of the immediately preceding paragraph, the layer comprising the nitride of Hf may further comprise Si.

In the coated article of any of the preceding two paragraphs, the layer comprising the nitride of Hf may further comprise Si and Al.

In the coated article of any of the preceding three paragraphs, the layer comprising the nitride of Hf may further comprise Zr.

In the coated article of any of the preceding four paragraphs, the layer comprising the nitride of Hf may further comprise Zr and Si.

In the coated article of any of the preceding five paragraphs, the layer comprising the nitride of Hf may further comprise Zr, Si and Al.

In the coated article of any of the preceding six paragraphs, the layer comprising the nitride of Hf may have a refractive index of at least 2.25, more preferably of at least 2.30 (at 550 nm).

In the coated article of any of the preceding seven paragraphs, the layer comprising the nitride of Hf may have an absorption coefficient (k) of no greater than 0.015, more preferably of no greater than 0.010 (at 400 nm).

In the coated article of any of the preceding eight paragraphs, the coated article may undergo a change in refractive index (n), at 550 nm, of no more than 0.04 due to heat treatment at 650° C. heat treatment for 8 minutes, more preferably of no more than 0.01 due to heat treatment at 650° C. heat treatment for 8 minutes.

In the coated article of any of the preceding nine paragraphs, the layer comprising the nitride of Hf may contain from 0-5% oxygen, more preferably from 0-2% oxygen (atomic %).

In the coated article of any of the preceding ten paragraphs, the coating may be a low-E coating and has a normal emissivity ($E_n$) of no greater than 0.2, more preferably of no greater than 0.10.

In the coated article of any of the preceding eleven paragraphs, the layer comprising the nitride of Hf may be amorphous or substantially amorphous.

In the coated article of any of the preceding twelve paragraphs, the first dielectric layer may comprise the nitride of hafnium (Hf), may contain from 0-10% oxygen (atomic %), may have a refractive index (n) of at least 2.21 at 550 nm, may have an absorption coefficient k of no greater than 0.02 at 400 nm, and may further comprise at least one of Zr, Si, and Al, and be located between at least the glass substrate and the IR reflecting layer.

In the coated article of any of the preceding thirteen paragraphs, the second dielectric layer may comprise the nitride of hafnium (Hf), may contain from 0-10% oxygen (atomic %), may have a refractive index (n) of at least 2.21 at 550 nm, may have an absorption coefficient k of no greater than 0.02 at 400 nm, and may further comprise at least one of Zr, Si, and Al, and is located on the glass substrate over at least the IR reflecting layer.

In the coated article of any of the preceding fourteen paragraphs, the coating may further comprise a layer comprising silicon nitride located over and directly contacting the layer comprising the nitride of Hf.

In the coated article of any of the preceding fifteen paragraphs, the coating may further comprise a layer comprising silicon nitride located between at least the glass substrate and the first transparent dielectric layer.

In the coated article of any of the preceding sixteen paragraphs, the coating may further comprise a layer comprising zinc oxide located under and directly contacting the IR reflecting layer.

In the coated article of any of the preceding seventeen paragraphs, the coating may further comprise a layer comprising Ni and/or Cr located over and directly contacting the IR reflecting layer.

In the coated article of any of the preceding eighteen paragraphs, the coating may further comprise a layer comprising an oxide of titanium that is directly contacting the second dielectric layer, and wherein the second dielectric layer: may comprise a nitride of hafnium (Hf), may contain from 0-10% oxygen (atomic %), may have a refractive index (n) of at least 2.21 at 550 nm, and may further comprise at least one of Zr, Si, and Al.

In the coated article of any of the preceding nineteen paragraphs, the coated article may be thermally tempered.

In the coated article of any of the preceding twenty paragraphs, the coated article may have a visible transmission of at least 50%.

In the coated article of any of the preceding twenty one paragraphs, the layer comprising the nitride of Hf may have a metal content comprising from 10-75% Hf, more preferably from 20-70% Hf, more preferably from 25-40% Hf (atomic %).

In the coated article of any of the preceding twenty two paragraphs, the layer comprising the nitride of Hf may have a metal content comprising from 20-70% Hf, from 1-40% Zr, from 3-20% Si, and from 1-45% Al (atomic %).

In the coated article of any of the preceding twenty three paragraphs, the layer comprising the nitride of Hf may contain more Hf than Si, and more Hf than Al (atomic %).

In the coated article of any of the preceding twenty four paragraphs, the layer comprising the nitride of Hf may further include Zr, where Hf and Zr contents summed together represent from 45-75% of metal content of the layer comprising the nitride of Hf (atomic %).

In the coated article of any of the preceding twenty five paragraphs, the layer comprising the nitride of Hf may further include Zr, where Hf and Zr contents summed together represent from 50-70% of metal content of the layer comprising the nitride of Hf (atomic %).

In the coated article of any of the preceding twenty six paragraphs, the layer comprising the nitride of Hf further comprises Al and may further comprise Zr, and may contain at least twice as much Al as Hf, more preferably at least three times as much Al as Hf, and possibly at least twice as much Al as each of Hf and Zr.

In the coated article of any of the preceding twenty seven paragraphs, the layer comprising the nitride of Hf may be free of, or substantially free of, Ti and/or Nb. The layer comprising the nitride of Hf may contain from 0-10% of Ti, more preferably from 0-5% Ti, and most preferably from 0-2% of Ti (atomic %). The layer comprising the nitride of Hf may contain from 0-10% of Nb, more preferably from 0-5% Nb, and most preferably from 0-2% of Nb.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a coating supported by a glass substrate, the coating comprising:
   a first dielectric layer on the glass substrate;
   an infrared (IR) reflecting layer comprising silver on the glass substrate, located over at least the first dielectric layer;
   a second dielectric layer on the glass substrate, located over at least the IR reflecting layer; and
   wherein the second dielectric layer comprises a nitride of hafnium (Hf), contains from 0-10% oxygen (atomic %), has a refractive index (n) of at least 2.21 at 550 nm, and further comprises at least one of Zr, Si, and Al.

2. The coated article of claim 1, wherein the layer comprising the nitride of Hf further comprises Si.

3. The coated article of claim 1, wherein the layer comprising the nitride of Hf further comprises Si and Al.

4. The coated article of claim 1, wherein the layer comprising the nitride of Hf further comprises Zr.

5. The coated article of claim 1, wherein the layer comprising the nitride of Hf further comprises Zr and Si.

6. The coated article of claim 1, wherein the layer comprising the nitride of Hf further comprises Zr, Si and Al.

7. The coated article of claim 1, wherein the layer comprising the nitride of Hf has a refractive index of at least 2.25 (at 550 nm).

8. The coated article of claim 1, wherein the layer comprising the nitride of Hf has an absorption coefficient (k) of no greater than 0.015 (at 400 nm).

9. The coated article of claim 1, wherein the layer comprising the nitride of Hf has an absorption coefficient (k) of no greater than 0.010 (at 400 nm).

10. The coated article of claim 1, wherein the coated article undergoes a change in refractive index (n), at 550 nm, of no more than 0.04 due to heat treatment at 650° C. heat treatment for 8 minutes.

11. The coated article of claim 1, wherein the coated article undergoes a change in refractive index (n), at 550 nm, of no more than 0.01 due to heat treatment at 650° C. heat treatment for 8 minutes.

12. The coated article of claim 1, wherein the layer comprising the nitride of Hf contains from 0-5% oxygen (atomic %).

13. The coated article of claim 1, wherien the layer comprising the nitride of Hf contains from 0-2% oxygen (atomic %).

14. The coated article of claim 1, wherein the coating is a low-E coating and has a normal emissivity ($E_n$) of no greater than 0.2.

15. The coated article of claim 1, wherein the coating is a low-E coating and has a normal emissivity ($E_n$) of no greater than 0.10.

16. The coated article of claim 1, wherein the layer comprising the nitride of Hf is amorphous or substantially amorphous.

17. The coated article of claim 1, wherein the first dielectric layer comprises the nitride of hafnium (Hf), contains from 0-10% oxygen (atomic %), has a refractive index (n) of at least 2.21 at 550 nm, has an absorption coefficient k of no greater than 0.02 at 400 nm, and further comprises at least one of Zr, Si, and Al, and is located between at least the glass substrate and the IR reflecting layer.

18. The coated article of claim 1, wherein the second dielectric layer comprises the nitride of hafnium (Hf), contains from 0-10% oxygen (atomic %), has a refractive index (n) of at least 2.21 at 550 nm, has an absorption coefficient k of no greater than 0.02 at 400 nm, and further comprises at least one of Zr, Si, and Al, and is located on the glass substrate over at least the IR reflecting layer.

19. The coated article of claim 18, wherein the coating further comprises a layer comprising silicon nitride located over and directly contacting the layer comprising the nitride of Hf.

20. The coated article of claim 1, wherein the coating further comprises a layer comprising silicon nitride located between at least the glass substrate and the first transparent dielectric layer.

21. The coated article of claim 1, wherein the coating further comprises a layer comprising zinc oxide located under and directly contacting the IR reflecting layer.

22. The coated article of claim 1, wherein the coating further comprises a layer comprising Ni and/or Cr located over and directly contacting the IR reflecting layer.

23. The coated article of claim 1, wherein the coating further comprises a layer comprising an oxide of titanium that is directly contacting the second dielectric layer, and wherein the second dielectric layer: comprises a nitride of hafnium (Hf), contains from 0-10% oxygen (atomic %), has a refractive index (n) of at least 2.21 at 550 nm, and further comprises at least one of Zr, Si, and Al.

24. The coated article of claim 1, wherein the coated article is thermally tempered.

25. The coated article of claim 1, wherein the coated article has a visible transmission of at least 50%.

26. The coated article of claim 1, wherein the layer comprising the nitride of Hf has a metal content comprising from 10-75% Hf.

27. The coated article of claim 1, wherein the layer comprising the nitride of Hf has a metal content comprising from 20-70% Hf.

28. The coated article of claim 1, wherein the layer comprising the nitride of Hf has a metal content comprising from 25-40% Hf.

29. The coated article of claim 1, wherein the layer comprising the nitride of Hf has a metal content comprising from 20-70% Hf, from 1-40% Zr, from 3-20% Si, and from 1-45% Al (atomic %).

30. The coated article of claim 1, wherein the layer comprising the nitride of Hf contains more Hf than Si, and more Hf than Al (atomic %).

31. The coated article of claim 1, wherein the layer comprising the nitride of Hf further includes Zr, and where Hf and Zr contents summed together represent from 45-75% of metal content of the layer comprising the nitride of Hf (atomic %).

32. The coated article of claim 1, wherein the layer comprising the nitride of Hf further includes Zr, and where Hf and Zr contents summed together represent from 50-70% of metal content of the layer comprising the nitride of Hf (atomic %).

33. The coated article of claim 1, wherein the layer comprising the nitride of Hf is substantially free of Ti and Nb.

34. The coated article of claim 1, wherein the layer comprising the nitride of Hf contains from 0-5% Ti and from 0-5% Nb.

35. A coated article including a coating supported by a glass substrate, the coating comprising:
    a first dielectric layer on the glass substrate;
    an infrared (IR) reflecting layer on the glass substrate, located over at least the first dielectric layer;

a second dielectric layer on the glass substrate, located over at least the IR reflecting layer;

a third dielectric layer on the glass substrate and located over at least the first and second dielectric layers; and wherein the second dielectric layer comprises a nitride of hafnium (Hf), has a refractive index (n) of at least 2.21 at 550 nm, and further comprises at least one of Zr, Si, and Al.

36. The coated article of claim 35, wherein the layer comprising the nitride of Hf further comprises Al and contains at least twice as much Al as Hf.

37. The coated article of claim 35, wherein the layer comprising the nitride of Hf further comprises Al and Zr, and contain at least twice as much Al as Hf, and at least twice as much Al as Zr.

38. The coated article of claim 35, wherein the third dielectric layer comprises silicon nitride.

39. The coated article of claim 35, wherein the layer comprising the nitride of Hf is substantially free of Ti and Nb.

40. A method of making a coated article including a coating supported by a glass substrate, the method comprising:

sputter depositing a first dielectric layer on the glass substrate;

sputter depositing a second dielectric layer on the glass substrate, located over at least the first dielectric layer;

sputter depositing a third dielectric layer on the glass substrate and located over at least the first and second dielectric layers; and wherein the second dielectric layer comprises a nitride of hafnium (Hf), has a refractive index (n) of at least 2.21 at 550 nm, and further comprises at least one of Zr, Si, and Al.

* * * * *